United States Patent [19]

Patterson et al.

[11] Patent Number: 4,843,188
[45] Date of Patent: Jun. 27, 1989

[54] INTEGRATED CIRCUIT CHIP MOUNTING AND PACKAGING ASSEMBLY

[75] Inventors: Timothy P. Patterson, Santa Ana; Carl E. Hoge, Encinitas, both of Calif.

[73] Assignee: Western Digital Corporation, Irvine, Calif.

[21] Appl. No.: 843,592

[22] Filed: Mar. 25, 1986

[51] Int. Cl.[4] .............................................. H01L 23/02
[52] U.S. Cl. ..................................... 174/52.4; 357/74
[58] Field of Search ................. 174/16 HS, 52 FP; 357/74; 339/17 CF; 439/78

[56] References Cited

U.S. PATENT DOCUMENTS

| | | | |
|---|---|---|---|
| 3,404,319 | 10/1968 | Tsuji et al. | 174/52 FP X |
| 3,984,620 | 10/1976 | Robillard et al. | 174/52 FP |
| 4,054,938 | 10/1977 | Morris, Sr. | 361/401 |
| 4,150,420 | 4/1979 | Berg | 361/401 |
| 4,285,002 | 8/1981 | Campbell | 357/74 |
| 4,396,935 | 8/1983 | Schuck | 357/74 |
| 4,517,584 | 5/1985 | Matsushita et al. | 357/74 X |
| 4,538,210 | 8/1985 | Schaller | 361/401 |
| 4,618,739 | 10/1986 | Theobold | 174/52 FP |

FOREIGN PATENT DOCUMENTS

| | | |
|---|---|---|
| 2607083 | 9/1977 | Fed. Rep. of Germany . |
| 2535110 | 4/1984 | France . |
| 1185857 | 3/1970 | United Kingdom . |
| 1371997 | 10/1974 | United Kingdom . |
| 2098398 | 11/1982 | United Kingdom . |

OTHER PUBLICATIONS

"Plastics for Electronics", Martin T. Goosey, Dynachem Corporation, Tustin, Calif., U.S.A., Elsevier Applied Science Publishers, 1985.

Primary Examiner—Arthur T. Grimley
Assistant Examiner—David A. Tone
Attorney, Agent, or Firm—Spensley Horn Jubas & Lubitz

[57] ABSTRACT

An integrated circuit chip mounting and packaging assembly is described. The assembly comprises a spreader having one or more chips centrally mounted thereon. A plurality of leads are disposed outward of the integrated circuit chip on the same side of the spreader as the chip. When fully assembled, the spreader is positioned, chip side down, over a cavity in a printed circuit board-like substrate. The cavity is ringed with connectors which contact the spreader leads and appropriately connect the integrated circuit chip to other electronic components mounted on the substrate.

34 Claims, 2 Drawing Sheets

INTEGRATED CIRCUIT CHIP MOUNTING AND PACKAGING ASSEMBLY

BACKGROUND OF THE INVENTION

This invention relates to the fields of printed circuit boards and integrated circuit chip packaging and mounting.

A variety of techniques exist for packaging integrated circuit chips and mounting them on a printed circuit board. Perhaps the most widely used technique is that of encapsulating a chip in epoxy or enclosing it in a ceramic package. With this technique, the chip is first mounted at the center of a plurality of radially extending leads. Then, fine wires are welded onto wire bonding pads on the chip. The opposite end of each of these wires is welded to the inner end of one of the radial leads. This process for electrically connecting the chip to the leads with fine wires is called "wire bonding." The chip and the inner end of each radial lead are then encapsulated in epoxy or enclosed in ceramic, with the outermost end of each lead being left exposed. The exposed ends of the leads are bent downward so that they may be plugged into an integrated circuit chip socket or soldered directly onto the printed circuit board. In this way, the chip is electrically and mechanically coupled to the printed circuit board.

This method of mounting and packaging integrated circuits has several advantages. For example, integrated circuit chips are occasionally damaged when wires are welded to the wire bonding pads on the chip surface. Therefore, it is important to test the chips after they are wire bonded to the leads. With this method, each chip may be tested after the chip is encapsulated in the epoxy or enclosed in the ceramic package, but before it is connected to the circuit board. If the chip does not function properly, it can be discarded and replaced with a functional chip. Furthermore, if a fully assembled circuit board should fail to function properly, the defective chip can be easily removed from its socket or unsoldered from the board and replaced with a functioning chip.

The epoxy and ceramic packaging materials also serve to protect the chip from moisture and other deleterious external influences which could corrode the wire bonded connections. However, the disadvantage of this technique is that each individually packaged chip takes up a relatively large amount of space on the printed circuit board. Thus, the density of individually packaged chips that can be put on a board is limited by the external dimensions of the chip packaging.

Another method for mounting integrated circuits on printed circuit boards is called the "chip-on-board" method. In the chip-on-board method, an unpackaged integrated circuit chip is glued or soldered directly onto the surface of the printed circuit board. The chip is then wire bonded directly to the printed conductive filaments (called "traces") of the printed circuit board. To protect the chip, which would otherwise be exposed to ambient conditions, the chip and wire connections are then covered with a drop of epoxy.

The chip-on-board technique can be cheaper than the previously described individual encapsulation method since the chip-on-board method does not require individual protective capsules for each chip. Furthermore, because individual capsules are not used, each chip mounted in this way takes up much less space on the printed circuit board than an equivalent encapsulated chip. Thus, chips mounted with the chip-on-board method can be more densely packed onto a board.

The chip-on-board technique, however, has several disadvantages. As previously mentioned, chips are occasionally damaged during the wire bonding process. Thus, since it is generally impractical to test each individual chip immediately after the chip is wire bonded to the board, testing must be delayed until all of the individual integrated circuit chips are mounted on and wire bonded to the board. Then, the entire board must be tested as a single functioning unit. This procedure results in a comparatively high percentage of defective boards since the probability of obtaining a functioning board is no greater than the product of the probabilities that each of the chips on the board is functional.

In addition, boards with chips mounted in this way cannot be economically repaired since the defective chips would have to be disconnected and replaced manually. This is a very expensive procedure. Thus, the chip-on-board technique can be used economically only for devices where the percentage of functioning boards is high and where the entire assembled board is relatively inexpensive so that few boards need to be discarded and the boards which are defective can be discarded without undue expense.

In contrast to these previously known techniques, the present invention combines the pre-test advantages of the individual chip encapsulation method with much of the space saving advantages of the chip-on-board technique.

SUMMARY OF THE INVENTION

This invention concerns a mounting and packaging assembly for electronic integrated circuit chips. In addition to the chips themselves, the assembly of the present invention has two other components, a spreader and a substrate.

The spreader is comprised of an insulating plate having conductive leads positioned on one surface of the plate and extending toward the periphery thereof. Away from the periphery and generally toward the center of the plate, one or more integrated circuits are mounted on the same side of the plate as the leads. The chip or chips are then wire bonded to the spreader leads. After the chip or chips are mounted and wire bonded to the spreader, each spreader and chip assembly may be tested individually to ensure that they are functioning and will operate reliably when incorporated into a fully assembled device.

The substrate is similar to a conventional printed circuit board in that it supports and electrically interconnects a variety of electronic components. Traces may be disposed either on the surface or within interior layers of the substrate, or both. The traces form a functioning circuit by interconnecting the various electronic components mounted on the substrate.

The substrate of the present invention differs from many conventional printed circuit boards in that the substrate has one or more cavities. A plurality of traces abut the edge of each cavity. These traces are disposed so that they will contact the leads on the spreader when the spreader is placed, chip side down, over the cavity.

When fully assembled, the spreader covers the mouth of the cavity, with the chip facing into the cavity and the leads of the spreader contacting the traces which abut the cavity rim. In this way, the integrated circuit or circuits mounted on the spreader are appropriately connected through the leads and traces to various other electronic components mounted on the substrate. The chip is also protected from ambient conditions since it is sealed between the spreader and the cavity walls.

A number of different techniques for holding the spreader in place come within the scope of the present invention. For example, the spreader may be held to the substrate by soldering the traces which abut the cavity rim to the opposing leads of the spreader. Such a solder connection may be made, for example, by first silk screening solder paste onto the spreader leads. The spreader is then placed, chip side down, over the cavity so that the spreader leads rest against the traces abutting the edge of the cavity. The edges of the spreader are then heated to melt the solder paste. When the solder resolidifies, it provides an electrical and mechanical connection between the spreader and the substrate.

Alternatively, opposing conductors on the spreader and substrate may be attached to each other by means of an electrically conductive polymer. The polymer may be applied to the spreader leads in a silk screening process similar to that used to apply the solder paste. In this case, when the polymer cures it will hold the spreader firmly in place.

The substrate may also be molded in three dimensions to form the casing of an electronic device. In this instance, the substrate would serve three functions simultaneously; it would form the casing of the device, function like a printed circuit board and serve as a protective package for the integrated circuit.

DETAILED DESCRIPTION OF THE PREFERRED EMBODIMENTS

Figure 1:
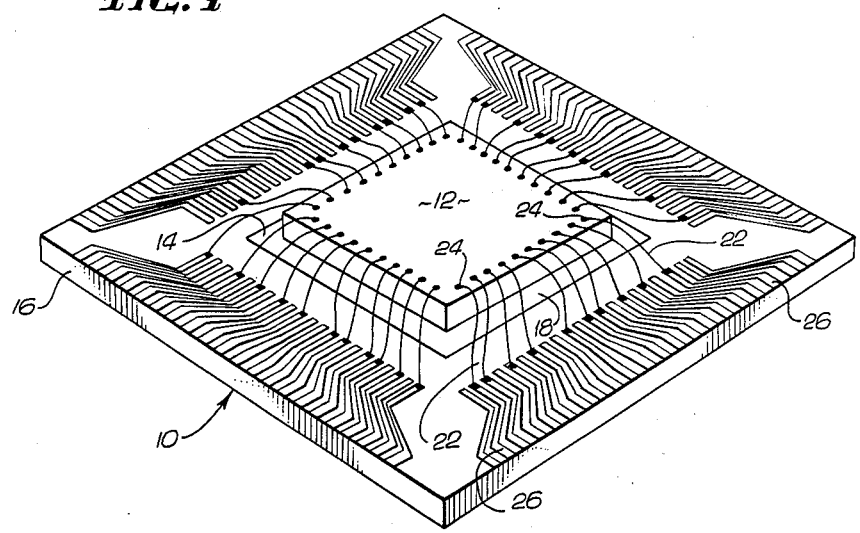
FIG. 1 illustrates an integrated circuit chip mounted in the center of a first embodiment of the spreader of the present invention. Wires connect the chip to the spreader leads.
Figure 2:
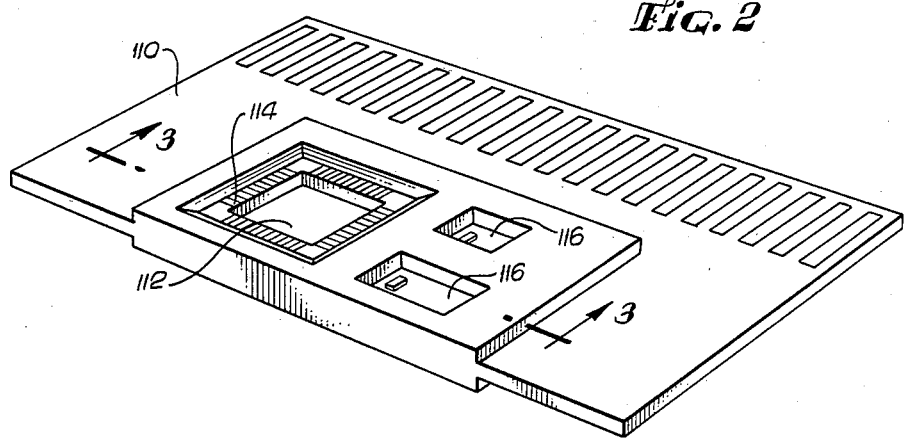
FIG. 2 illustrates a first embodiment of the molded substrate of the present invention having a single large cavity to receive the chip-spreader assembly and two small cavities to receive other types of electronic circuit components.
Figure 3:
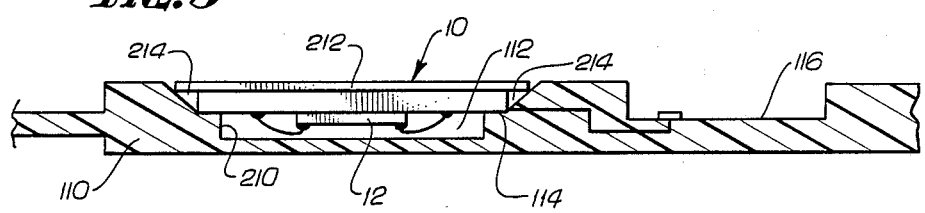
FIG. 3 is a cross-sectional view of the substrate of FIG. 2 taken along the line 3—3. In addition, an integrated circuit chip, spreader and a heat sink are shown positioned within the mouth of the substrate cavity.

FIGS. 1-3 illustrate various components of the first embodiment of the integrated circuit chip mounting and packaging assembly of the present invention. FIG. 1 is a perspective view of a spreader 10. In this figure, a chip 12 is soldered to a metallized bonding pad 14 in the center of a spreader plate 16. The bonding pad 14 has a notch 18 which is used to distinguish the four-sided symmetry of the spreader 10 and chip 12 so that the spreader 10 can be properly positioned on the substrate (see FIG. 3). Fine wires 22 electrically connect or "wire bond" bonding pads 24 on the chip 12 to appropriate copper leads 26 on the spreader 10.

FIG. 1 illustrates a spreader 10 having eighty-four leads. In this particular figure, the spreader 10 has forty-four more leads 26 than are required to connect each of the bonding pads 24 of the chip 12. Thus, some of the leads 26 will simply not be used in this particular illustration. However, if a chip requiring eighty-four external connections were bonded to the spreader 10, then all the leads 26 would be used.

FIG. 2 is a perspective view of a substrate 110 constructed according to the teachings of the present invention. The substrate 110 has a cavity 112 which receives the spreader 10, with the chip 12 facing toward the cavity. Exposed ends of a plurality of copper traces 114 are disposed around the periphery of the cavity 112 to align with and connect to the spreader leads 26. The traces 114 are laminated within the substrate 110 and will appropriately interconnect the chip 12 mounted on the spreader 10 to various other electronic components which can be mounted on the substrate 110.

The substrate 110 in FIG. 2 contains two additional cavities 116 which may, if appropriate, contain conventional discrete devices (not shown). The two additional cavities 116 are shown for illustrative purposes only. Any actual substrate would have a number of other electronic components mounted in or on the substrate, and traces appropriately interconnecting these components as required for the functioning of the particular circuit.

The embodiment of FIG. 2 also has conductive strips 117 positioned along the edge of the substrate 110. Traces within the substrate 110 connect the conductive strips 117 and the various electronic components mounted on the substrate 110. The strips 117 enable these electronic components to be electrically connected to other components through a conventional printed circuit board edge connector.

FIG. 3 is a cross-sectional view of the substrate 110 of FIG. 2 taken along the line 3—3. FIG. 3 also shows the chip-spreader assembly of FIG. 1 positioned at the mouth of the substrate cavity 112. As can be seen from FIG. 3, the spreader 10 is disposed with the chip 12 facing down into the cavity 112 so that the chip 12 is encapsulated between the spreader 10 and the walls 210 of the substrate 110 which form the cavity 112.

FIG. 3 also shows a heat sink 212 mounted on the side of the spreader 10 opposite the chip 12. In this particular illustration, the spreader 10 is recessed into the mouth of the cavity 112 so that the heat sink 212 is flush with the surface of the substrate 110. Since the heat sink 212 is exposed to the atmosphere and has a larger surface area than the chip 12, the heat sink 212 can help to cool the chip 12. The heat sink helps cool the chip by absorbing heat from the chip through the spreader and dissipating the absorbed heat into the surrounding atmosphere. If desired, heat conducting members (not shown) can be molded into the spreader plate 16. These heat conducting members would have one of their ends connected to the bonding pad 14 and the other end to the heat sink 212. In this way, heat from the chip 12 would be conducted through the heat conducting members to the heat sink 212.

The chip-spreader assembly can be fixed to the substrate 110 in a number of ways. For example, solder paste can be silk screened onto the copper leads 26 of the spreader 10. Then, when the spreader 10 is placed over the cavity 112 with the chip 12 facing the interior of the cavity 112, as shown in FIG. 3, the entire substrate 110 and spreader 10 assembly can be placed in a furnace until the solder paste melts. The molten solder will solder each spreader lead 26 to the opposing trace 114. Thus, the substrate 110 and spreader 10 must be made of an insulating material which can withstand the temperature of molten solder.

After the solder paste melts, the entire assembly is removed from the furnace. When the molten solder resolidifies, it electrically and mechanically interconnects the chip-spreader assembly to the substrate 110.

The chip-spreader assembly can also be fixed to the substrate 110 by silk screening a conductive polymer glue onto the leads 26 of the spreader 10. To attach the spreader 10 to the substrate 110, the spreader 10 is simply inverted and positioned over the cavity 112 so that the spreader leads 26 contact the traces 114 abutting the periphery of the cavity 112. When the polymer cures, it will firmly hold the spreader 10 to the substrate 110 and electrically connect the spreader leads 26 to the traces 114.

The spreader leads 26 of the embodiment illustrated in FIGS. 1-3 project radially out from the center of the spreader 10. Since each lead 26 is spaced from the next adjacent lead 26, moisture may be able to seep between adjacent leads 26 into the substrate cavity 112 and corrode the electrical contacts between the chip 12, the connecting wires 22 and the leads 26. In order to prevent this from occurring, as shown in FIG. 3, a bead of sealant 214 can be placed between the edge of the spreader 10 and the substrate.

Figure 4:
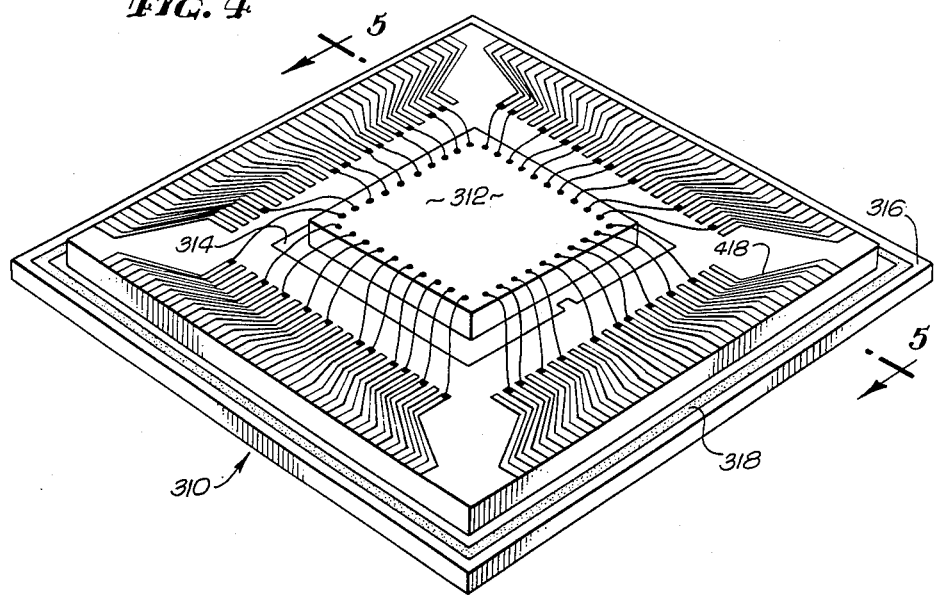
FIG. 4 illustrates an integrated circuit chip mounted in the center of a second embodiment of the spreader of the present invention. A sealing ring is formed around the edge of the spreader.

FIG. 4 illustrates a second embodiment of the spreader 310 of the present invention. Like the previously described embodiment, the spreader 310 of FIG. 4 has a chip 312 mounted to a bonding pad 314 at the center of the spreader 310. However, the embodiment of FIG. 4 also provides a step 316 around the edge of the spreader 310. In addition, a solderable copper sealing ring 318 is positioned on the surface of the step 316.

Figure 5:
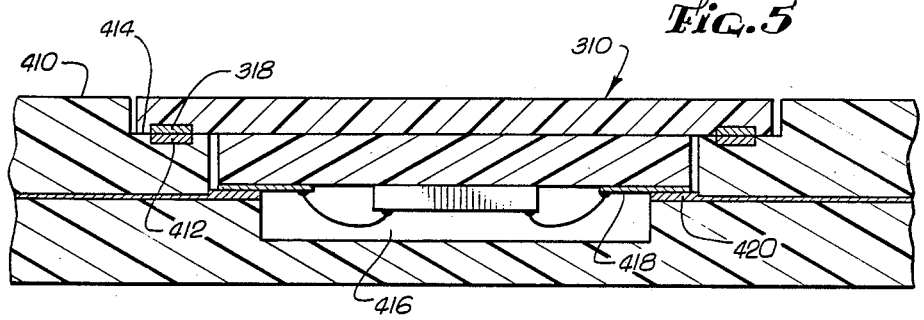
FIG. 5 is a cross-sectional view of the spreader of FIG. 4 taken along the line 5—5. The spreader is shown, mounted chip side down, in a substrate having a sealing ring which opposes the sealing ring on the spreader.

FIG. 5 is a cross-sectional view of the spreader 310 of FIG. 4 taken along the line 5—5 in FIG. 4. FIG. 5 also illustrates a substrate 410 having a solderable copper sealing ring 412 formed in a step 414 at the mouth of the substrate cavity 416. The sealing ring 412 in the cavity opposes the sealing ring 318 in the spreader 310.

Before attaching the spreader-chip assembly to the substrate 410, as shown in FIG. 5, solder paste is silk screened onto both the sealing ring 318 on the spreader 310 and the leads 418. The chip-spreader assembly is then placed, chip side down, over the cavity 416. When the solder paste is melted, opposing spreader leads 418 and traces 420 will be soldered together as in the previous embodiment. Additionally, however, the two opposing sealing rings 318, 412 will also be soldered together. Thus, when the solder resolidifies, it will not only provide electrical and mechanical connections between opposing leads and traces, but in addition, a hermetic seal around the entire cavity 416. This seal will keep moisture out of the cavity.

Figure 6:
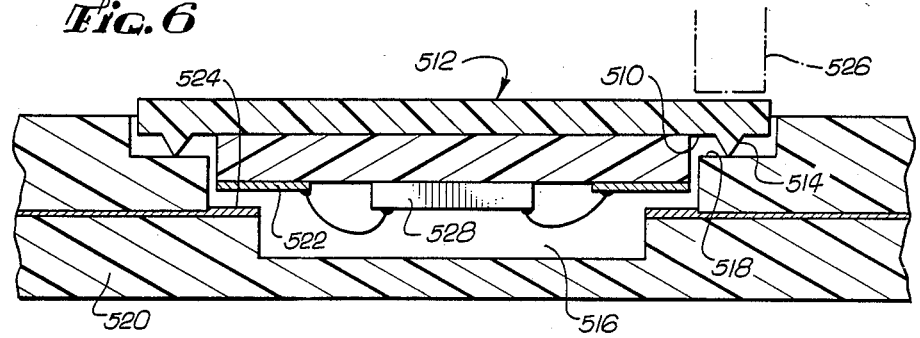
FIG. 6 is a cross-sectional view of a third embodiment of the present invention. In this figure, a spreader is positioned, chip side down, over a cavity in the substrate. The spreader has a pointed thermoplastic sealing ridge molded around its periphery.

FIG. 6 illustrates a third embodiment of the present invention. Like the embodiment of FIG. 4, this embodiment also has a step 510 around the edge of the spreader 512. The spreader 512 and substrate 520 of this embodiment are made of a thermoplastic material and a pointed ridge 514 is molded into the step 510. The ridge 514 extends along the step 510 around all four sides of the spreader 512. When placed over the substrate cavity 516, chip side down, the point of the ridge 514 rests on a step 518 molded into the substrate 520 at the mouth of the cavity 518. As with the two previously described embodiments, the spreader leads 522 align with opposing races 524 at the mouth of the cavity 516. However, because the spreader 512 is resting on the pointed ridge 514, the spreader leads 522 are held apart from the traces 524.

As in the previously described embodiment, the leads 522 of the spreader 512 are coated with solder paste before the spreader 512 is positioned over the mouth of the cavity 516. When an ultrasonic welder 526 is touched to the exposed back surface of the spreader 512, friction between the point of the spreader ridge 514 and its contact point on the substrate step 518 cause the tip of the ridge 514 and the step 518 to melt together. The spreader 512 then drops down into the cavity 516 until the leads 522 come to rest against the traces 524. The melted ridge 514 forms a leak-tight seal around the substrate cavity 516.

The leads 522 can then be soldered to the traces 524 by placing the entire assembly in a furnace to melt the solder paste and then allowing the assembly to cool and the solder to resolidify. In this way, solder will electrically and mechanically attach the spreader 512 to substrate 520. The ultrasonically melted ridge 514 around the spreader 512 also helps to hold the spreader 512 to the substrate 520 while at the same time hermetically sealing the chip 528 within the substrate cavity 516.

Three preferred embodiments of the present invention have been described. Nevertheless, it is understood that one may make various modifications without departing from the spirit and scope of the invention. For example, the sealing rings of FIGS. 4 and 5 may be positioned on the same level of the spreader as the leads. In this configuration, there would not be a step around the edge of the spreader nor a matching step in the substrate. Similarly the pointed ridge of FIG. 6 may also be positioned on the same level of the spreader as the leads. Thus, the invention is not limited to the preferred embodiments described herein, but may be altered in a variety of ways which are apparent to persons skilled in the art.

We claim:

1. An electronic component mounting and packaging assembly, comprising:
   an insulating printed circuit board substrate having a cavity therein and a plurality of electronic component connection locations on said substrate disposed at a distance from said cavity;
   a plurality of first conductors each having an end spaced about the periphery of the mouth of said cavity, wherein said first conductors are electrically coupled to the electronic connection locations;
   an insulating member covering the mouth of said cavity, said member having a first side facing the interior of said cavity and an electronic component bonding pad centrally located on the first side;
   a plurality of second conductors, said second conductors being disposed on the first side of the said insulating member so that each one of said second conductors contacts a first conductor;

an electronic component, substantially one entire side of the component being mounted to the bonding pad of said insulating member; and connecting means for electrically connecting said electronic component to said second conductors.

2. An electronic component mounting and packaging assembly as in claim 1, wherein the electronic component mounted on the first side of said insulating member is an integrated circuit chip.

3. An electronic component mounting and packaging assembly as in claim 1, further comprising sealant between said substrate and said insulating member hermetically sealing said cavity.

4. An electronic component mounting and packaging assembly as in claim 1, wherein said insulating member has a second side opposite said first side and said assembly further comprises a heat sink mounted on said second side.

5. An electronic component mounting and packaging assembly, comprising:
   an insulating substrate having a cavity therein and a plurality of electronic component connection locations on said substrate disposed at a distance from said cavity;
   a plurality of first conductors each having an end spaced about the periphery of the mouth of said cavity, wherein said first conductors are electrically coupled to the electronic component connection locations;
   an insulating member covering the mouth of said cavity, said member having a first side facing the interior of said cavity;
   a plurality of second conductors, said second conductors being disposed on the first side of said insulating member so that each on of said second conductors contacts a first conductor;
   an electronic component mounted on the first side of said insulating member;
   connecting means for electrically connecting said electronic component to said second conductors;
   a first band of sealable material on said substrate surrounding the mouth of said cavity outward of the ends of said first conductors;
   a second band of sealable material on the first side of said insulating member surrounding said second conductors so that said second band opposes said first band; and
   sealant between said first and second bands hermetically sealing the cavity.

6. An electronic component mounting and packaging assembly as in claim 5, wherein said sealant is solder.

7. An electronic component mounting and packaging assembly as in claim 5, wherein said sealant is a polymer.

8. An electronic component mounting and packaging assembly, comprising:
   an insulating substrate having a cavity therein and a plurality of electronic component connection locations on said substrate disposed at a distance from said cavity;
   a plurality of first conductors each having an end spaced about the periphery of the mouth of said cavity, wherein said first conductors are electrically coupled to the electronic component connection locations;
   an insulating member covering the mouth of said cavity, said member having a first side facing the interior of said cavity;
   a plurality of second conductors, said second conductors being disposed on the first side of said insulating member so that each one of said second conductors opposes one of said first conductors;
   an electronic component mounted on the first side of said insulating member;
   connecting means for electrically connecting said electronic component to said second conductors; and
   a ridge of thermoplastic material protruding from said first side of said insulating member, said ridge encircling said second conductors.

9. An electronic component mounting and packaging assembly as in claim 8, wherein the electronic component mounted on the first side of said insulating member is an integrated circuit chip.

10. An electronic component mounting and packaging assembly as in claim 8, wherein said insulating member has a second side opposite said first side and said assembly further comprises a heat sink mounted on said second side.

11. An electronic component mounting and packaging assembly as in claim 8, wherein said insulating substrate, said insulating member and said ridge are made of identical thermoplastic material.

12. An integrated circuit chip mounting assembly, comprising:
   a nonconductive member having a first side;
   an integrated circuit chip bonding pad centrally located on said first side;
   a first plurality of conductive leads disposed on the first side of the nonconductive member, said leads being spaced from said pad and disposed such that one end of each lead is located closer to the center of said nonconductive member then the opposite end of each lead; and
   a printed circuit board having a cavity therein into which said first nonconductive member is placed, said printed circuit board having a second plurality of conductive leads located within said cavity which respectively contact said first plurality of conductive leads 13. An integrated circuit chip mounting assembly as in claim 12, further comprising a band of sealable material on said first side encircling said first leads.

14. An integrated circuit chip mounting assembly, comprising:
   a nonconductive member having a first side;
   an integrated circuit chip bonding pad centrally located on said first side;
   a plurality of conductive leads disposed only on the first side of the nonconductive member, said leads being spaced from said pad and disposed such that one end of each lead is located closer to the center of said nonconductive member than the opposite end of each lead; and
   a ridge of thermoplastic material protruding from said first side, said ridge encircling said leads.

15. An integrated circuit chip mounting assembly as in claim 12, further comprising:
   an integrated circuit chip mounted on said bonding pad;
   a plurality of wires, one end of each of said wires being connected to the chip and the opposite end of each of said wires being connected to the more central end of one of said first leads.

16. An integrated circuit chip mounting assembly as in claim 14, wherein said nonconductive member has a second side opposite said first side and said assembly further comprises a heat sink mounted on said second side.

17. An integrated circuit chip mounting assembly as in claim 12, 13 or 15, wherein said non-conductive member has a second side opposite said first side and said assembly further comprises a heat sink mounted on said second side.

18. An integrated circuit mounting assembly, comprising:
- a rigid nonconducting member having a first side;
- an integrated circuit chip having a first side and a second side;
- an integrated circuit chip bonding pad located on said first side of said nonconductive member which bonds said entire first side of said integrated circuit chip to said nonconductive member;
- a first plurality of conductive traces disposed on said first side of said nonconductive member, said traces being spaced from said bonding pad;
- electrical connection means extending between predetermined locations of said second side of said integrated circuit chip and predetermined traces for forming electrical connections therebetween; and
- a printed circuit board having a cavity formed in one surface over which cavity said nonconductive member is disposed to cover said cavity, said printed circuit board having a second plurality of conductive traces which extend from adjacent the edge of said cavity to remote locations of said printed circuit board, each of said second plurality of conductive traces contacting a corresponding first conductive trace 19. An integrated circuit mounting assembly according to claim 18 wherein said cavity has a depth sufficient to allow said nonconductive member, including said integrated circuit chip, bonding pad, first plurality of conductive traces and electrical connection means, to be entirely placed therein.

20. An integrated circuit mounting assembly according to claim 18, wherein said printed circuit board and nonconductive member are formed of the same composition.

21. An integrated circuit mounting assembly according to claim 20 wherein said composition is a thermoplastic material.

22. An integrated circuit mounting assembly according to claim 18, wherein said electrical connection means comprises electrically conductive wires.

23. An integrated circuit mounting assembly according to claim 18, wherein said nonconductive member includes a step-shaped contour approximately adjacent its perphery and said cavity of said printed circuit board includes a corresponding step-shaped contour approximately adjacent its edge, at least one surface of said step-shaped contour of said cavity contacting at least one surface of said step-shaped contour of said nonconductive member.

24. An integrated circuit mounting assembly according to claim 23, wherein said at least one surface of said step-shaped contour of said nonconductive member is soldered to said at least one surface of said step-shaped contour of said cavity to form a leak-tight junction therebetween.

25. An integrated circuit mounting assembly according to claim 23, wherein said at least one surface of said step-shaped contour of said nonconductive member is thermoplastically welded to said at least one surface of said step-shaped contour of said cavity to form a leak-tight junction therebetween.

26. An integrated circuit mounting assembly according to claim 18, further comprising conductive solder electrically connecting each of said second plurality of conductive traces with said corresponding first plurality of conductive traces.

27. An integrated circuit mounting assembly according to claim 18, further comprising a conductive polymer glue electrically connecting each of said second plurality of conductive traces with said corresponding fist plurality of conductive traces.

28. An integrated circuit mounting assembly according to claim 18, further comprising a heat sink, wherein said nonconductive member includes a second side on which said heat sink is mounted.

29. An integrated circuit mounting assembly, comprising:
- a rigid nonconductive member having a first side;
- an integrated circuit chip having a first side and a second side;
- an integrated circuit chip bonding pad located on said first side of said nonconductive member which bonds said first side of said integrated circuit chip to said nonconductive member;
- a first plurality of conductive traces disposed on one first side of said nonconductive member, said traces being spaced from said bonding pad;
- wires extending between predetermined locations of said second side of said integrated circuit chip and predetermined traces for forming electrical connections therebetween; and
- a printed circuit board having a cavity formed in one surface over which cavity said nonconductive member is disposed to cover said cavity, said printed circuit board having a second plurality of conductive traces which extend from adjacent the edge of said cavity to remote locations of said printed circuit board, each of said second plurality of conductive traces contacting a corresponding first conductive trace.

30. An integrated circuit mounting assembly according to claim 29 wherein said cavity has a depth sufficient to allow said nonconductive member, including said integrated circuit chip, bonding pad, first plurality of conductive traces and wires, to be entirely placed therein.

31. An integrated circuit mounting assembly according to claim 29, wherein said printed circuit board and nonconductive member are formed of a similar composition.

32. An integrated circuit mounting assembly according to claim 31 wherein said composition is a thermoplastic material.

33. An integrated circuit mounting assembly according to claim 29, wherein the entirety of said first side of said integrated circuit chip is bonded to said nonconductive member by said bonding pad.

34. An integrated circuit mounting assembly according to claim 29, further comprising a heat sink, wherein said nonconductive member includes a second side on which said heat sink is mounted.

* * * * *